(12) United States Patent
King (10) Patent No.: US 11,967,663 B2
(45) Date of Patent: Apr. 23, 2024

(54) MULTI-JUNCTION SOLAR CELLS WITH THIN-FILM, POLYCRYSTALLINE, LOW-BANDGAP BOTTOM CELLS

(71) Applicant: Richard R. King, Tempe, AZ (US)

(72) Inventor: Richard R. King, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 17/347,486

(22) Filed: Jun. 14, 2021

(65) Prior Publication Data
US 2021/0391487 A1    Dec. 16, 2021

Related U.S. Application Data

(60) Provisional application No. 63/038,360, filed on Jun. 12, 2020, provisional application No. 63/039,436, filed on Jun. 15, 2020.

(51) Int. Cl.
*H01L 31/0725* (2012.01)
*H01L 31/073* (2012.01)
*H01L 31/0735* (2012.01)

(52) U.S. Cl.
CPC ........ *H01L 31/0725* (2013.01); *H01L 31/073* (2013.01); *H01L 31/0735* (2013.01)

(58) Field of Classification Search
CPC ............... H01L 31/0725; H01L 31/073; H01L 31/0735
See application file for complete search history.

(56) References Cited

U.S. PATENT DOCUMENTS

| | | | |
|---|---|---|---|
| 2010/0096001 A1* | 4/2010 | Sivananthan | H01L 31/0687 136/249 |
| 2011/0062446 A1* | 3/2011 | Goyal | H01L 21/02381 257/64 |
| 2011/0139227 A1* | 6/2011 | Sivananthan | H01L 31/0725 136/255 |
| 2013/0025655 A1* | 1/2013 | Bedell | H01L 31/204 136/255 |
| 2013/0025658 A1* | 1/2013 | Bedell | H01L 31/1808 136/255 |
| 2014/0209149 A1* | 7/2014 | Mascarenhas | H01L 31/0687 438/74 |
| 2014/0261611 A1* | 9/2014 | King | H01L 31/035209 136/244 |
| 2014/0305498 A1* | 10/2014 | Liu | H01L 31/0392 136/255 |
| 2018/0062020 A1* | 3/2018 | Fafard | H01L 31/0304 |
| 2019/0341506 A1* | 11/2019 | Sampath | H01L 31/065 |

* cited by examiner

*Primary Examiner* — Mayla Gonzalez Ramos
(74) *Attorney, Agent, or Firm* — Fish & Richardson P.C.

(57) ABSTRACT

A multi junction solar cell includes one or more upper cells and a thin-film, polycrystalline, low-bandgap bottom cell. A single-junction solar cell includes a polycrystalline semiconductor thin film, wherein a bandgap of the solar cell is greater than 1.2 eV or less than 1.2 eV, and the solar cell is configured to receive light through two surfaces, such that the bottom cell has bifacial operation.

30 Claims, 12 Drawing Sheets

MULTI-JUNCTION SOLAR CELLS WITH THIN-FILM, POLYCRYSTALLINE, LOW-BANDGAP BOTTOM CELLS

TECHNICAL FIELD

This application claims the benefit of U.S. Patent Application No. 63/038,360 filed on Jun. 12 2020, and U.S. Patent Application No. 63/039,436 filed on Jun. 15, 2020, both of which are incorporated by reference herein in their entirety.

This invention relates to multi junction solar cells with thin-film, polycrystalline low bandgap bottom cells.

BACKGROUND

A photovoltaic cell, or solar cell, is a type of photoelectric cell that converts light energy into electrical energy. Photovoltaic cells are typically made of two types of silicon: n-type and p-type. n-type silicon has an excess of electrons, and p-type silicon has an excess of positively charged holes, or vacancies. The n-type silicon and p-type silicon are in the form of layers that form a p-n junction. Electrons from the n-type layer move into holes in the p-type layer when a photovoltaic cell is exposed to sunlight, creating a flow of electricity when the n-type layer and p-type layer are electrically connected. Thus, photovoltaic cells produce solar power. A single-junction solar cell has a single p-n junction. Solar modules, or photovoltaic modules, are typically referred to as solar panels.

SUMMARY

Multi junction thin-film solar cells, including tandem (2-junction) solar cells, with high efficiencies (e.g., at least 25%) are disclosed. These multi junction solar cells may have one or more of a polycrystalline, thin-film, low-bandgap bottom cell, transparent back contact on the top cell, transparent back contact on the bottom cell, and bifacial operation of the bottom cell. In addition to higher efficiency, advantages of the cells described include avoiding: the problems of subcell current imbalance, whether due to constantly changing spectral conditions or manufacturing variation; excessive materials and fabrication cost of processing and integrating subcells on separate substrates; and potential materials incompatibility of subcell and interconnect materials.

In a first general aspect, a multi junction solar cell includes one or more upper cells and a thin-film, polycrystalline, low-bandgap bottom cell.

Implementations of the first general aspect may include one or more of the following features.

In some implementations, the solar cell includes one, two, or three upper cells above the low-bandgap bottom cell. One or more of the one or more upper cells can be a Cd(Se)Te cell. The bottom cell can have a bandgap in a range of 0.3 eV to 1.2 eV. The bottom cell can be configured to receive light though two surfaces, such that the bottom cell has bifacial operation.

In some implementations, the bottom cell includes an absorber or a base, an emitter, a back surface field, one or more interconnect layers, or any combination thereof. In some cases, the absorber or the base, the emitter, the back surface field, or any combination thereof can include CdHgTe. In some cases, the absorber or the base, the emitter, the back surface field, or any combination thereof includes amorphous or polycrystalline Ge or SiGe. In some cases, the absorber or the base includes GaInSb, and the emitter, the back surface field, or both include AlGaInSb. In some cases, the absorber or the base, the emitter, the back surface field, or any combination thereof includes $Sb_2(Se_yTe_{1-y})_3$ (SST), $(Sb_xBi_{1-x})_2Se_3$ (SBS), or $(Sb_xBi_{1-x})_2(Se_yTe_{1-y})_3$ (SBST). In some cases, the emitter includes an n-type layer, an n-type layer and an intrinsic layer, a p-type layer, or a p-type layer and an intrinsic layer. In some cases, the back surface field includes a p-type layer, a p-type layer and an intrinsic layer, an n-type layer, or an n-type layer and an intrinsic layer.

In a second general aspect, a single-junction solar cell includes a polycrystalline semiconductor thin film, wherein a bandgap of the solar cell is greater than 1.2 eV, and the solar cell is configured to receive light through two surfaces, such that the bottom cell has bifacial operation.

Implementations of the second general aspect may include one or more of the following features.

In some implementations, the bandgap of the solar cell is between 1.4 eV and 1.6 eV.

In some implementations, the solar cell includes an absorber or a base, an emitter, a back surface field, or any combination thereof. In some cases, the emitter includes an n-type layer, an n-type layer and an intrinsic layer, a p-type layer, or a p-type layer and an intrinsic layer. In some cases, the back surface field includes a p-type layer, a p-type layer and an intrinsic layer, an n-type layer, or an n-type layer and an intrinsic layer. In some cases, the absorber or the base, the emitter, the back surface field, or any combination thereof includes CdHgTe. In some cases, the absorber or the base, the emitter, the back surface field, or any combination thereof includes amorphous or polycrystalline Ge or SiGe. In some cases, the absorber or the base includes GaInSb, and the emitter, the back surface field, or both include AlGaInSb. In some cases, the absorber or the base, the emitter, the back surface field, or any combination thereof includes $Sb_2(Se_yTe_{1-y})_3$ (SST), $(Sb_xBi_{1-x})_2Se_3$ (SBS), or $(Sb_xBi_{1-x})_2(Se_yTe_{1-y})_3$ SBST).

In a third general aspect, a single junction solar cell includes a polycrystalline semiconductor thin film, wherein a bandgap of the solar cell is less than 1.2 eV, and the solar cell is configured to receive light through two surfaces, such that the bottom cell has bifacial operation.

Implementations of the third general aspect may include one or more of the following features.

In some implementations, the bandgap of the solar cell is between 1.0 eV and 1.2 eV. The solar cell can include an absorber or a base, an emitter, a back surface field, or any combination thereof. In some cases, the emitter includes an n-type layer, an n-type layer and an intrinsic layer, a p-type layer, or a p-type layer and an intrinsic layer. In some cases, the back surface field includes a p-type layer, a p-type layer and an intrinsic layer, an n-type layer, or an n-type layer and an intrinsic layer. In some cases, the absorber or the base, the emitter, the back surface field, or any combination thereof includes CdHgTe. In some cases, the absorber or the base, the emitter, the back surface field, or any combination thereof includes amorphous or polycrystalline Ge or SiGe. In some cases, the absorber or the base includes GaInSb, and the emitter, the back surface field, or both include AlGaInSb. In some cases, the absorber or the base, the emitter, the back surface field, or any combination thereof includes $Sb_2(Se_yTe_{1-y})_3$ (SST), $(Sb_xBi_{1-x})_2Se_3$ (SBS), or $(Sb_xBi_{1-x})_2(Se_yTe_{1-y})_3$ (SBST).

In some implementations, several polycrystalline semiconductor and other layers are positioned at the back of a superstrate II-VI (e.g., CdTe) top cell to form a low bandgap bottom cell after the top cell has been formed, allowing one-sun efficiencies of 30% or higher to be reached. The solar cell achieves these high efficiencies at least in part by enabling photons with energy less than the bandgap of the top cell to be utilized to contribute to the power output of the multi junction cell.

Some implementations (e.g., bifacial configurations), allow greater latitude in the design choice of top cell bandgap, bottom cell bandgap, top cell reflectance and absorption, interlayer reflectance and absorptance, and bottom cell charge carrier collection efficiency. The bifacial operation and resulting excess photogenerated current in the bottom cell overcomes potential problems associated with the requirements for current matching subcells in series-interconnected multi-junction cells.

The details of one or more embodiments of the subject matter of this disclosure are set forth in the accompanying drawings and the description. Other features, aspects, and advantages of the subject matter will become apparent from the description, the drawings, and the claims.

DETAILED DESCRIPTION

Single-junction thin-film solar cells have low cost and moderate efficiency, but are limited in efficiency by their inability to use photons with energy lower than the absorber bandgap and inefficient use of high-energy photons. Multi junction cells, which include multiple light absorbing materials, each of which converts a given wavelength range of the solar spectrum, can be used to provide greater conversion efficiency than single-junction thin-film solar cells. However, fabrication of multi junction cells presents a variety of challenges. First, it can be difficult to find semiconductor materials that simultaneously have the right bandgaps to partition the solar spectrum (to produce the same current density in each subcell of multi-junction cell in which subcells of different bandgaps are connected in series), low recombination rates (leading to high output voltages), low material cost, and low fabrication costs. Second, it can be difficult to find materials and processes to electrically interconnect subcells of different bandgaps in the multi junction cell with high electrical conductivity, high optical transmittance for light that needs to reach the subcells beneath, materials compatibility such that the interconnect materials do not damage adjacent cell materials, and low material and fabrication costs for the interconnection materials. Third, if the different subcells are each processed separately on different substrates for later integration into the multi junction cell, the fabrication cost is multiplied by approximately the number of subcells, plus additional cost to then integrate the subcells if the integration process has additional materials, processing steps, or less than unity manufacturing yield. Fourth, if additional contacts or terminals are made to each subcell to avoid the problem of current balancing the subcells, and to avoid problems regarding materials compatibility, electrical conductance, and optical transmittance of the interconnect layers, then it can be difficult to access the contacts between subcells without incurring excessive series resistance, cell shadowing, and other losses. Thus, there is a need for multi junction cell designs which circumvent one or more of these problems.

Multi junction solar cells with high conversion efficiency and low cost are described, in which an added bottom cell layer or layers are deposited on back of the polycrystalline top cell (monolithic configuration) or deposited on a separate glass or other substrate and adhered to the back of the polycrystalline top cell (multi-substrate configuration). The polycrystalline top cell can include one or more II-VI semiconductors, and can have a light absorber or base, largely composed of one or more II-VI semiconductors. Additionally, the light incident on the bottom cell can come only from the top direction, as light transmitted through the top cell or through gaps in the top cell material (monofacial configuration), or come from both the top direction and from the bottom direction, where light from the bottom direction is transmitted through a transparent back contact or transparent back substrate on the back of the bottom cell or through gaps in the back contact or back substrate, or from a diffuse or specular reflector positioned behind the solar module such that reflected or refracted light is incident on the back of the bottom cell (bifacial configuration).

The top (or sunward) cell of a multi junction or tandem solar cell is the subcell that is closest to the sunward surface in the finished multi junction or tandem solar cell, while the bottom cell is the subcell that is farthest from the sunward surface. Upper cells are the subcells of a multi junction cell above the bottom cell. Thin-film solar cells are typically grown or deposited in a superstrate configuration, i.e., in which the layers of the solar cell near the sunward surface (the front surface) of the solar cell are deposited first on a transparent mechanical support sheet called the superstrate, that is, before the layers of the solar cell farthest from the sunward surface. Alternatively, thin-film solar cells can be grown or deposited in a substrate configuration, i.e., in which the layers of the solar cell farthest from the sunward surface (i.e., closest to the back surface) are deposited first on a mechanical support sheet which may be opaque or transparent, called the substrate.

Because the bottom cell in a tandem (2-junction) or multi junction cell typically contributes less power than any of the other subcells, the electrical requirements for the bottom cell are relaxed, allowing a wider range of semiconductor compositions, deposition processes, and annealing processes to be used for the bottom cell. Because the superstrate top cell is deposited before the low bandgap bottom cell in the monolithic, superstrate configuration, or separately from the low bandgap bottom cell in the multi-substrate configuration, the high-power-producing top cell can be deposited with the highly developed process that has been developed for single-junction cells, without potential detrimental effects that result when a top cell is grown on a new bottom cell material. Because the bottom cell is grown after the top cell in the monolithic, superstrate configuration, or separately from the top cell in the multi-substrate configuration, the bottom cell is not subject to degradation that could result from the thermal budget of growing a top cell on an already formed bottom cell.

Forming the back metal contact to the multi junction cell on the back of the low bandgap bottom cell in the monolithic configuration avoids the common problem of forming a low resistance contact to the back of a CdTe solar cell. Since the bottom cell layers are composed of polycrystalline semiconductor layers grown monolithically on the top cell in this case, they add only marginally to the cost of forming the semiconductor device, and do not add to the cost of forming top and back contacts, monolithic cell integration in the module, the glass transparent mechanical support, module encapsulation, the module junction box and attachment points, module supports, and other balance-of-module and balance-of-system costs. In a monofacial case when the top cell includes CdTe, the bottom cell preferably has a relatively low bandgap (<1 eV, and preferably 0.5-0.8 eV, and still more preferably 0.6-0.7 eV), resulting in a lower fill factor for the bottom cell than the fill factor would be for a higher bandgap bottom cell, making the multi junction cell power output more consistent over a wider range of spectral and current mismatch conditions which can result from varying air mass throughout the day and year, and due to meteorological conditions.

In the bifacial case, additional light enters the bottom cell through a transparent back contact, e.g., diffusely reflected light from a high albedo background behind the module that is transmitted through a glass backing of the module. This creates additional photogenerated current density in the bottom cell. This allows the tandem solar cell design to use a higher bandgap bottom cell, use a lower bandgap top cell, use a top cell with higher reflectivity or greater light absorption, use interconnect layers between top and bottom cells with higher reflectivity or greater light absorption, and/or use a bottom cell with lower minority-carrier collection efficiency than would otherwise be possible, all of which are advantageous to the tandem solar cell design flexibility, power conversion efficiency, cost, and manufacturability.

These advantages are particularly prevalent when the top cell and bottom cell are connected in series, in a current-matched configuration, where a low current density in the bottom cell can limit the current of all subcells in the multi junction stack, limiting efficiency. With extra photogenerated current density in the bottom cell due to light incident on the bottom cell from the back through a transparent back contact and transparent module backsheet, a tandem (2-junction) cell or multi junction cell configuration that was current-limited by the bottom cell without bifacial operation can now be current matched with much greater efficiency using bifacial photogeneration in the bottom cell. This is an advantage of bifacial response for the tandem or multi junction cell configuration, not only increasing the total incident light on the module but also increasing the efficiency of the tandem or multi junction cell due to the bifacial response.

The low bandgap polycrystalline bottom cell base or main light absorber layer typically includes one or more of CdHgTe, CdHgSe, ZnHgSe, (Zn,Cd,Hg)(S,Se,Te), CdTe, Ge, Si, SiGe, GaSb, GaInAs, GaInSb, AlGaSb, AlInSb, InPAs, InPSb, (Al,Ga,In)(P,As,Sb,Bi), (Cu,Ag)(Ga,In)(S,Se)$_2$, perovskite semiconductors such as $CH_3NH_3PbI_3$ and related materials, (e.g., containing Sn, Cs, Br and other elements), $Sb_2(Se_yTe_{1-y})_3$(SST), $(Sb_xBi_{1-x})_2Se_3$(SBS), $(Sb_xBi_{1-x})_2(Se_yTe_{1-y})_3$(SBST), and other bottom cell absorber materials. The top cell base or absorber material typically includes one or more of CdTe (or an alloy of CdTe with one or more of Mg, Zn, S, Se, and others), high bandgap polycrystalline (Cu,Ag)(Ga,In)(S,Se)$_2$-based semiconductors, and other thin-film solar cell materials with bandgap greater than about 1.0 eV, and preferably greater than about 1.4 eV.

Additional solar cells forming the multi junction stack can be added above the first (top) solar cell, below the second cell, or both, resulting in a polycrystalline thin-film multi-junction cell with 3 or more component cells or subcells, which can have either monofacial operation or bifacial operation through a transparent back contact of the bottom cell and transparent module backsheet.

In some implementations, the transparent back contact on a polycrystalline thin-film, transparent module backsheet, and bifacial operation elements are incorporated in a module with only the top component cell alone, or only the bottom component cell alone, in a polycrystalline single junction thin-film module with a transparent back contact on the single-junction thin-film cell, transparent module backsheet, and bifacial operation in which light entering the polycrystalline thin-film cell—such as CdTe and other II-VI materials—from the back of the cell (the side away from the sun) generates additional photocurrent resulting in greater efficiency in the bifacial, polycrystalline thin-film single-junction module.

FIGS. 1-12 depict examples of single-, 2-, 3-, and 4-junction solar cell configurations with selected combinations of features described herein.

Figure 1:
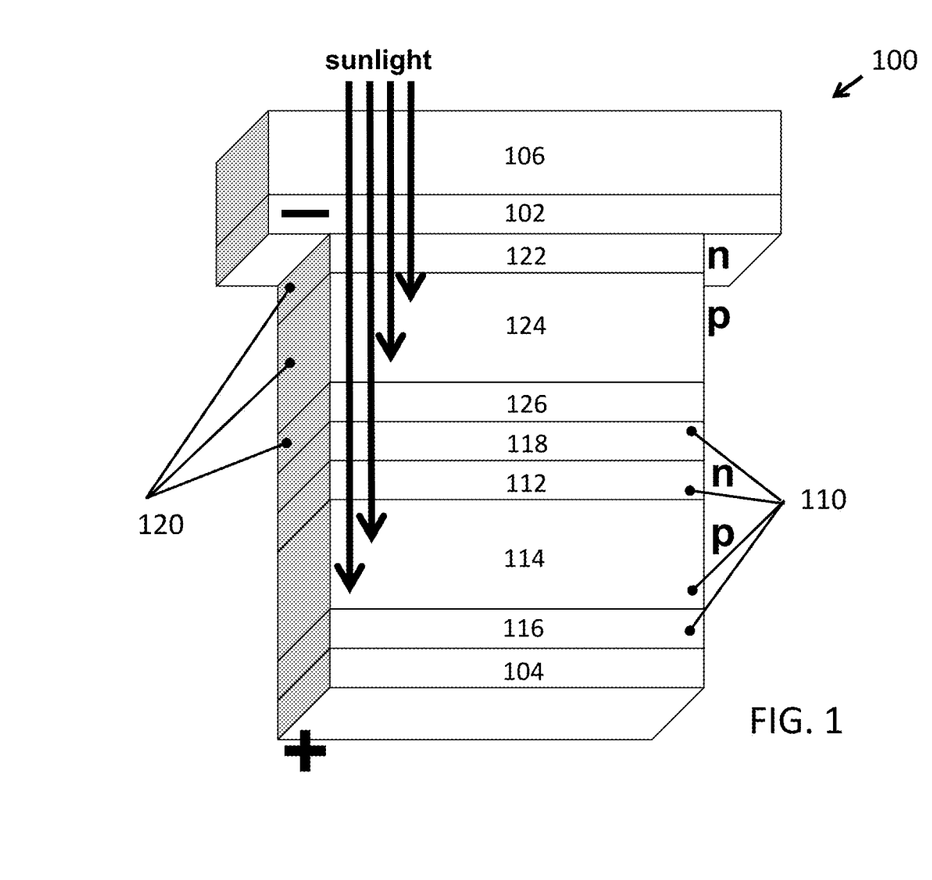
FIG. 1 depicts an example of a 2-junction solar cell configuration with a thin-film, polycrystalline, low-bandgap bottom cell.

FIG. 1 depicts an example of a 2-junction solar cell 100 including a thin-film, polycrystalline, low-bandgap bottom cell 110 and a top cell 120. The thin-film bottom cell 110 includes an n-type heteroemitter 112, a thin-film, polcrystalline, low-bandgap p-type absorber or base 114, a p-type back surface field (BSF) 116, and an interconnect layer 118 (e.g., TCO). The thin-film bottom cell 110 typically has a bandgap in a range of 0.3-1.2 eV. The optimum bottom cell bandgap depends at least in part on the bandgap of the top cell 120. Top cell 120 includes an n-type heteroemitter 122 (e.g., n-MgZnO), a polycrystalline p-type absorber or base 124 (e.g., p-CdTe), and a p-type BSF 126 (e.g., p-ZnTe). Top cell 120 and bottom cell 110 are in contact (e.g., direct contact) between the interconnect layer 118 and the p-type BSF 126, and positioned between an interconnect layer 102 and a metal back layer 104. A supersubstrate 106 (e.g., glass) is positioned on (e.g., in direct contact with) the interconnect layer 102. One implementation has a Cd(Se)Te-based top cell 120 and a bottom cell 110 with a bandgap in the range of 0.5-0.8 eV. In other implementations, the bottom cell bandgap is in the range of 0.6-0.75 eV.

Figure 2:
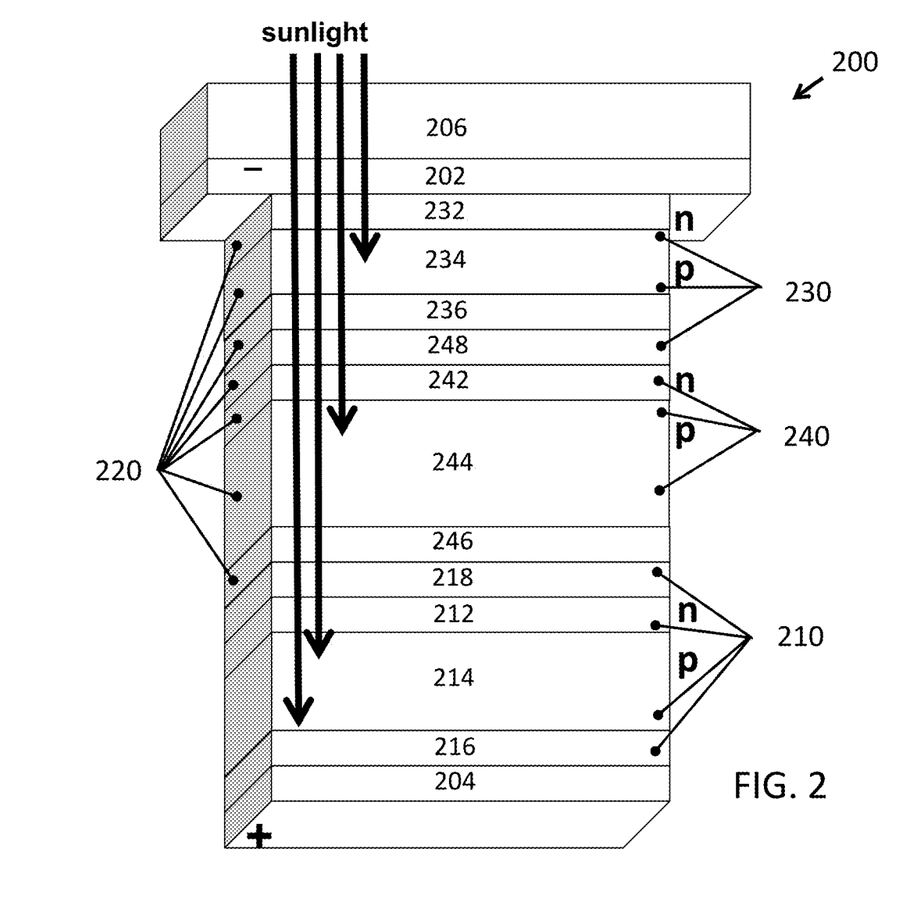
FIG. 2 depicts an example of a 3-junction solar cell configuration with a thin-film, polycrystalline, low-bandgap bottom cell.

FIG. 2 depicts an example of a 3-junction solar cell 200 including a thin-film, polycrystalline, low-bandgap bottom cell 210 and a 2-junction top cell 220. The bottom cell 210 includes an n-type heteroemitter 212, a a thin-film, polcrystalline, low-bandgap p-type absorber or base 214, a p-type BSF 216, and an interconnect layer 218 (e.g., TCO). The thin-film bottom cell 210 typically has a bandgap in a range of 0.3-1.2 eV. The optimum bottom cell bandgap depends at least in part on the bandgap of the first upper cell 230 and the second upper cell 240 that make up the 2-junction top cell 220, and are defined as the cells above the bottom cell 210. The first upper cell 230 includes an n-type heteroemitter 232 (e.g., nMgZnO), a p-type polycrystalline absorber or base 234 (e.g., p-type CdTe), and a p-type BSF 236. The second upper cell 240 includes an n-type heteroemitter 242 (e.g., n-MgZnO), a polycrystalline p-type absorber or base 244 (e.g., p-CdSeTe), a p-type BSF 246, and an interconnect layer 248 (e.g., TCO). The top cell 220 and the bottom cell 210 are in contact (e.g., in direct contact) between the interconnect layer 218 and the p-type BSF 246, and are positioned between an interconnect layer 202 and a back metal layer 204. The superstrate 206 (e.g., glass) is positioned on (e.g., in direct contact with) the interconnect layer 202. One implementation is shown with a Cd(Se)Te-based first upper cell 230 and a Cd(Se)Te second upper cell 240, forming a 2-junction Cd(Se)Te-based top cell 220 above the bottom cell 210, and a bottom cell 210 having a bandgap in the range of 0.7-1.2 eV. In other implementations, the bottom cell bandgap is in a range of 0.8-1.0 eV.

Figure 3:
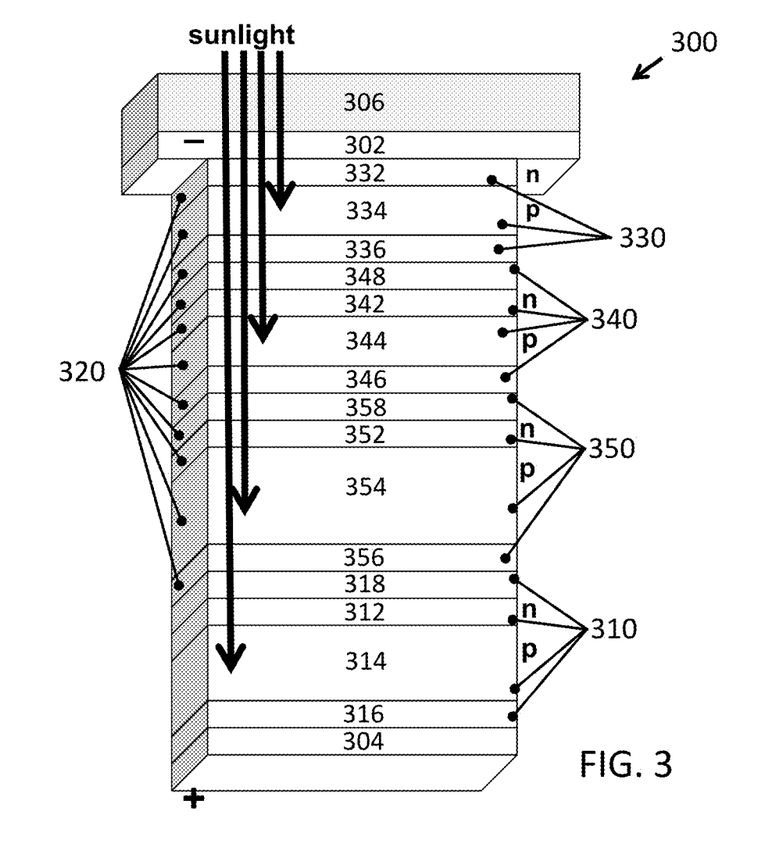
FIG. 3 depicts an example of a 4-junction solar cell configuration with a thin-film, polycrystalline, low-bandgap bottom cell.

FIG. 3 depicts an example of a 4-junction solar cell 300 including a thin-film, polycrystalline, low-bandgap bottom cell 310 and a 3-junction top cell 320. The thin-film bottom cell 310 includes an n-type heteroemitter 312, a a thin-film, polcrystalline, low-bandgap p-type polycrystalline absorber or base 314, a p-type BSF 316, and an interconnect layer 318 (e.g., TCO). The thin-film bottom cell 310 typically has a bandgap in a range of 0.3-1.2 eV. The optimum bottom cell bandgap depends at least in part on the bandgap of the first upper cell 330, the second upper cell 340, and the third upper cell 350 that make up the top cell 320, and are defined as the cells above the bottom cell 310. The first upper cell 330 includes an n-type heteroemitter 332 (e.g., n-MgZnO), a p-type polycrystalline absorber or base 334 (e.g., p-CdTe), and a p-type BSF 336 (e.g., p-ZnTe). The second upper cell 340 includes an n-type heteroemitter 342 (e.g., n-MgZnO), a polycrystalline p-type absorber or base 344 (e.g., p-CdSeTe), a p-type BSF 346, and an interconnect layer 348 (e.g., TCO). The third upper cell 350 includes an n-type heteroemitter 352 (e.g., n-MgZnO), a polycrystalline p-type absorber or base 354 (e.g., p-CdSeTe), a p-type BSF 356, and an interconnect layer 358 (e.g., TCO). Top cell 320 and bottom cell 310 are in contact (e.g., in direct contact) between interconnect layer 318 and p-type BSF 356, and are positioned between interconnect layer 302 and metal back metal layer 304. Superstrate 306 (e.g., glass) is positioned on (e.g., in direct contact with) interconnect layer 302. One implementation includes a Cd(Se)Te-based first upper cell 330, a Cd(Se)Te-based second upper cell 340, and a Cd(Se)Te-based third upper cell 350, forming a 3-junction Cd(Se)Te-based top cell 320 above the bottom cell 310 having a bandgap in the range of 0.7-1.2 eV. In other implementations, the bottom cell bandgap is in a range of 0.95-1.15 eV.

Figure 4:
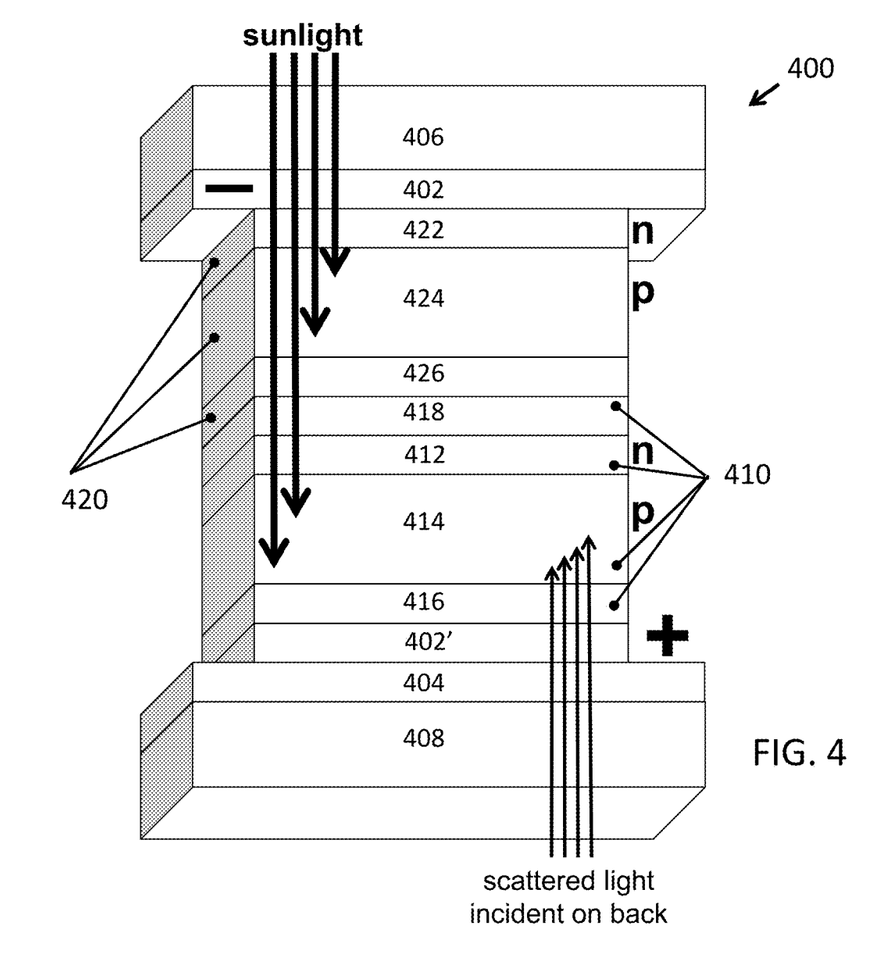
FIG. 4 depicts an example of a 2-junction solar cell configuration with a thin-film, polycrystalline, low-bandgap bottom cell receiving light from the back surface as well as the front (sunward) surface.

FIG. 4 depicts an example of a 2-junction solar cell 400 including a thin-film, polycrystalline, low-bandgap bottom cell 410 and a top cell 420. The thin-film bottom cell 410 includes an n-type heteroemitter 412, a polcrystalline p-type absorber or base 414, a p-type back surface field (BSF) 416, and an interconnect layer 418 (e.g., TCO). Top cell 420 includes an n-type heteroemitter 422 (e.g., n-MgZnO), a polycrystalline p-type absorber or base 424 (e.g., p-type CdTe), and a p-type BSF 426 (e.g., p-ZnTe). Top cell 420 and bottom cell 410 are in contact (e.g., direct contact) between the interconnect layer 418 and the p-type BSF 426, and are positioned between top interconnect layer 402 and bottom interconnect layer 402'. Superstrate 406 (e.g., glass) is positioned on (e.g., in direct contact with) interconnect layer 402. Encapsulant 404 is between bottom interconnect layer layer 402' and module backplane 408 (e.g., glass). The bottom cell 410 receives light from the back surface 408 (module backplane) and encapsulant 404, as well as from the front (sunward) surface 406 (superstrate), so that the thin-film bottom cell 410 has bifacial operation. The added current density from back side illumination—e.g., due to scattered light from the surroundings of the solar cell 400 or a solar module including a multiplicity of the solar cells 400—can help to improve current matching between the thin-film bottom cell 410 and the top cell 420 in a series-connected configuration.

Figure 5:
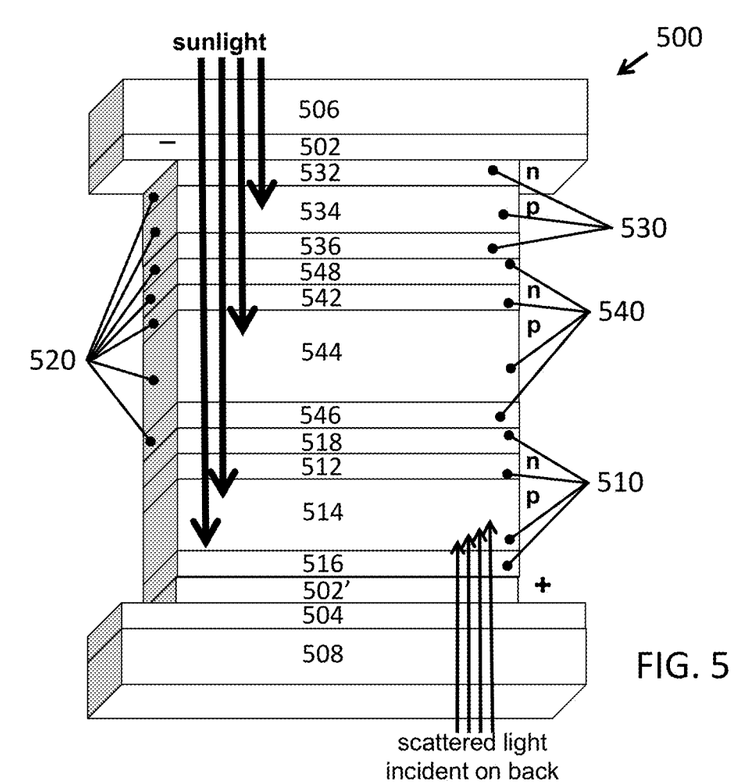
FIG. 5 depicts an example of a 3-junction solar cell configuration with a thin-film, polycrystalline, low-bandgap bottom cell receiving light from the back surface as well as the front (sunward) surface.

FIG. 5 depicts an example of a 3-junction solar cell 500 including a thin-film, polycrystalline, low-bandgap bottom cell 510 and a 2-junction top cell 530. The thin-film bottom cell 510 includes an n-type heteroemitter 512, a thin-film, polcrystalline, low-bandgap p-type absorber or base 514, a p-type BSF 516, and an interconnect layer 518 (e.g., TCO). The thin-film bottom cell 510 typically has a bandgap in a range of 0.3-1.2 eV. The first upper cell 530 and the second upper cell 540 make up the top cell 520, and are defined as the cells above the bottom cell 510. The first upper cell 530 includes an n-type heteroemitter 532 (e.g., n-MgZnO), a p-type polycrystalline absorber or base 534 (e.g., p-type CdTe), and a p-type BSF 536 (e.g., p-type ZnTe). The second upper cell 540 includes an n-type heteroemitter 542 (e.g., n-MgZnO), a polycrystalline p-type absorber or base 544 (e.g., p-type CdSeTe), a p-type BSF 546 (e.g., p-type ZnTe), and an interconnect layer 548 (e.g., TCO). Top cell 520 and bottom cell 510 are in contact (e.g., in direct contact) between interconnect layer 518 and p-type BSF 546, and are positioned between top interconnect layer 502 and bottom interconnect layer 502'. Superstrate 506 (e.g., glass) is positioned on (e.g., in direct contact with) interconnect layer 502. Encapsulant 504 is between bottom interconnect layer layer 502' and module backplane 508 (e.g., glass). The bottom cell 510 receives light from the back surface 508 (glass module backplane) and encapsulant 504 as well as from the front (sunward) surface 506 (superstrate), so that the thin-film bottom cell 510 has bifacial operation. The added current density from back side illumination—e.g., due to scattered light from the surroundings of the solar cell 500 or a solar module including a multiplicity of the solar cells 500—can help to improve current matching between the thin-film bottom cell 510 and the upper cells 530 and 540 in a series-connected configuration.

Figure 6:
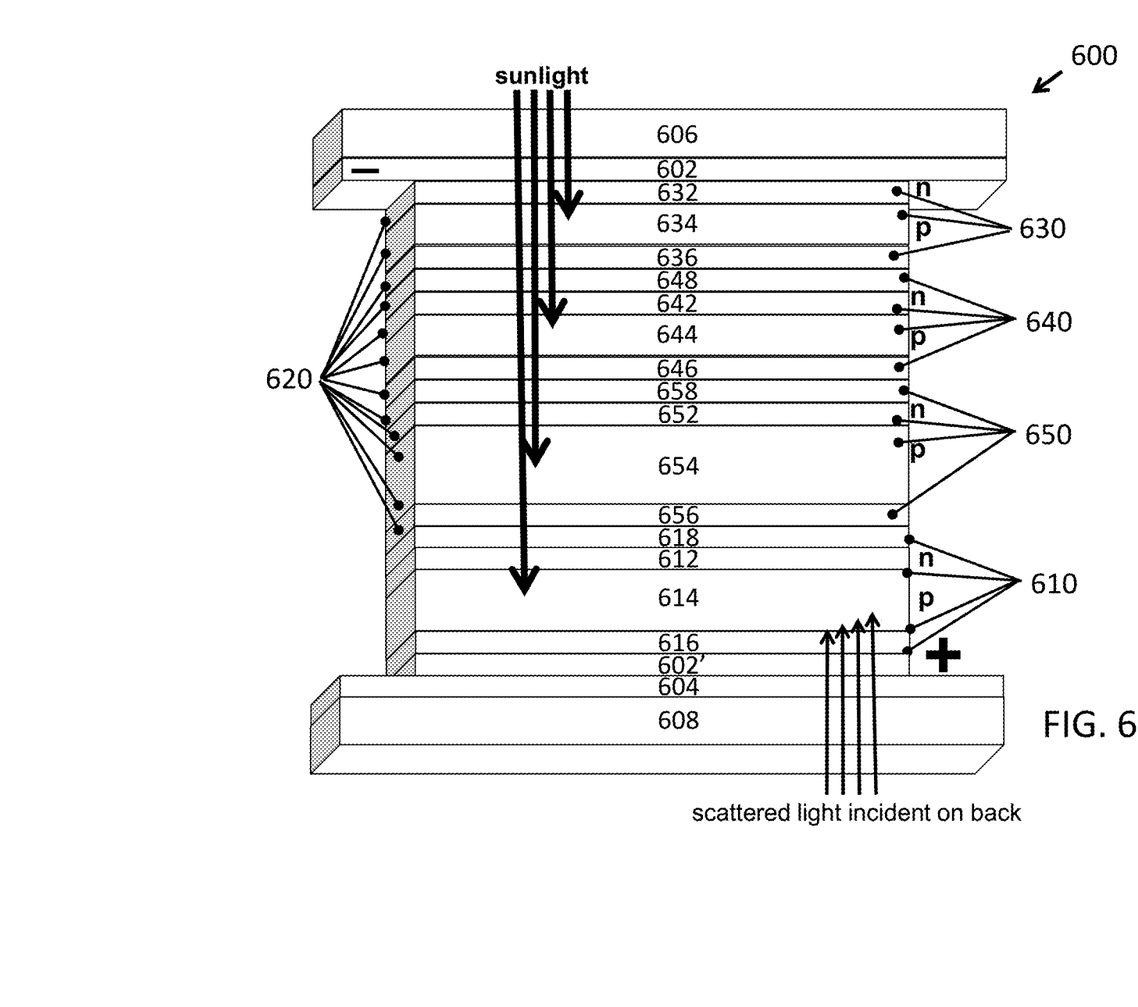
FIG. 6 depicts an example of a 4-junction solar cell configuration with a thin-film, polycrystalline, low-bandgap bottom cell receiving light from the back surface as well as the front (sunward) surface.

FIG. 6 depicts an example of a 4-junction solar cell 600 including a thin-film, polycrystalline, low-bandgap bottom cell 610 and a 3-junction top cell 620. The thin-film bottom cell 610 includes an n-type heteroemitter 612, a a thin-film, polcrystalline, low-bandgap p-type polycrystalline absorber or base 614, a p-type BSF 616, and an interconnect layer 618 (e.g., TCO). The first upper cell 630, the second upper cell 640, and the third upper cell 650 make up the top cell 620, and are defined as the cells above the bottom cell 610. The first upper cell 630 includes an n-type heteroemitter 632 (e.g., n-MgZnO), a p-type polycrystalline absorber or base 634 (e.g., p-CdTe), and a p-type BSF 636 (e.g., p-ZnTe). The second upper cell 640 includes an n-type heteroemitter 642 (e.g., n-MgZnO), a polycrystalline p-type absorber or base 644 (e.g., p-CdSeTe), a p-type BSF 646 (e.g., p-ZnTe), and an interconnect layer 648 (e.g., TCO). The third upper cell 650 includes an n-type heteroemitter 652 (e.g., n-MgZnO), a polycrystalline p-type absorber or base 654 (e.g., p CdSeTe), a p-type BSF 656 (e.g., p-ZnTe), and an interconnect layer 658 (e.g., TCO). Top cell 620 and bottom cell 610 are in contact (e.g., in direct contact) between interconnect layer 618 and p-type BSF 656, and are positioned between top interconnect layer 602 and bottom interconnect layer 602'. Superstrate 606 (e.g., glass) is positioned on (e.g., in direct contact with) interconnect layer 602. The encapsulant 604 (e.g., EVA) is between bottom interconnect layer layer 602' and module backplane 608 (e.g., glass). The bottom cell 610 receives light from the back surface 608 (glass module backplane) and the encapsulant 604 as well as from the front (sunward) surface 606 (superstrate), so that the thin-film bottom cell 610 has bifacial operation. The added current density from back side illumination—e.g., due to scattered light from the surroundings of the solar cell 600 or a solar module including a multiplicity of the solar cells 600—can help to improve current matching between the thin-film bottom cell 610 and the upper cells 630, 640, and 650 in a series-connected configuration.

Figure 7:
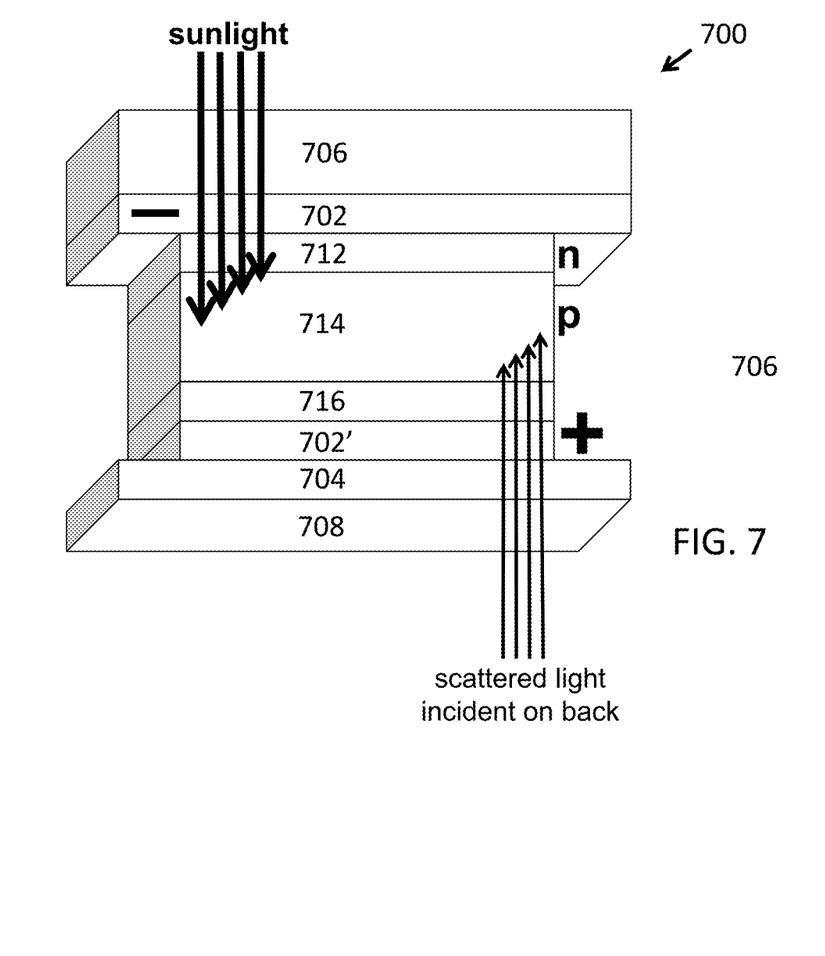
FIG. 7 depicts an example of a high-bandgap polycrystalline semiconductor thin film forming a single-junction solar cell with a bandgap greater than 1.2 eV, receiving light from the back surface as well as the front (sunward) surface.

FIG. 7 depicts an example of a high-bandgap polycrystalline semiconductor thin film forming a single junction solar cell 700 with bandgap greater than 1.2 eV (e.g., between 1.4 and 1.6 eV). Solar cell 700 includes an n-type heteroemitter 712, a polcrystalline p-type absorber or base 714 (e.g., p-type CdTe), a p-type back surface field (BSF) 716 (e.g., p-ZnTe) between interconnect layers 702 and 702' (e.g., TCO). Superstrate 706 (e.g., glass) is positioned on (e.g., in direct contact with) interconnect layer 702. Encapsulant 704 (e.g., EVA) is between bottom interconnect layer layer 702' and module backplane 708 (e.g., glass). Solar cell 700 receives light from the back surface 708 (module backplane) as well as from the front (sunward) surface 706 (superstrate), so that the thin-film, greater-than-1.2-eV solar cell 700 has bifacial operation. The back side illumination—e.g., due to scattered light from the surroundings of the solar cell 700 or a solar module including a multiplicity of solar cells 700—adds to the current density and efficiency of the thin-film >1.2-eV single-junction solar cell 700.

Figure 8:
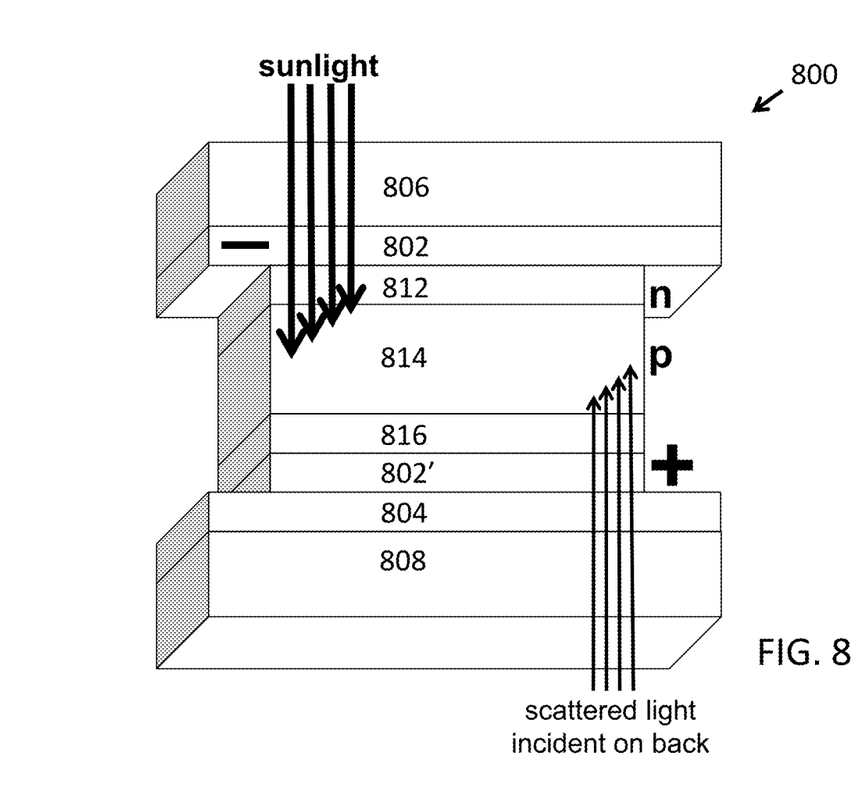
FIG. 8 depicts an example of a low-bandgap polycrystalline semiconductor thin film forming a single-junction solar cell with a bandgap less than 1.2 eV, receiving light from the back surface as well as the front (sunward) surface.

FIG. 8 depicts an example of a low-bandgap polycrystalline semiconductor thin film forming a single junction solar cell 800 with a bandgap less than 1.2 eV (e.g., between 1.0 and 1.2 eV). Solar cell 800 includes an n-type heteroemitter 812 (e.g., n-MgZnO), a thin-film, polcrystalline, low-bandgap p-type absorber or base 814, and a p-type BSF 816 (e.g., p-ZnTe) between interconnect layers 802 and 802' (e.g., TCO). Superstrate 806 (e.g., glass) is positioned on (e.g., in direct contact with) interconnect layer 802. Encapsulant 804 (e.g., EVA) is between bottom interconnect layer layer 802' and module backplane 808 (e.g., glass). Solar cell 800 receives light from the back surface 808 (module backplane) as well as from the front (sunward) surface 806 (superstrate), so that the thin-film, less-than-1.2-eV solar cell 800 has bifacial operation. The back side illumination—e.g., due to scattered light from the surroundings of the solar cell 800 or a solar module including a multiplicity of the solar cells 800—adds to the current density and efficiency of the thin-film <1.2-eV single junction solar cell 800.

Figure 9:
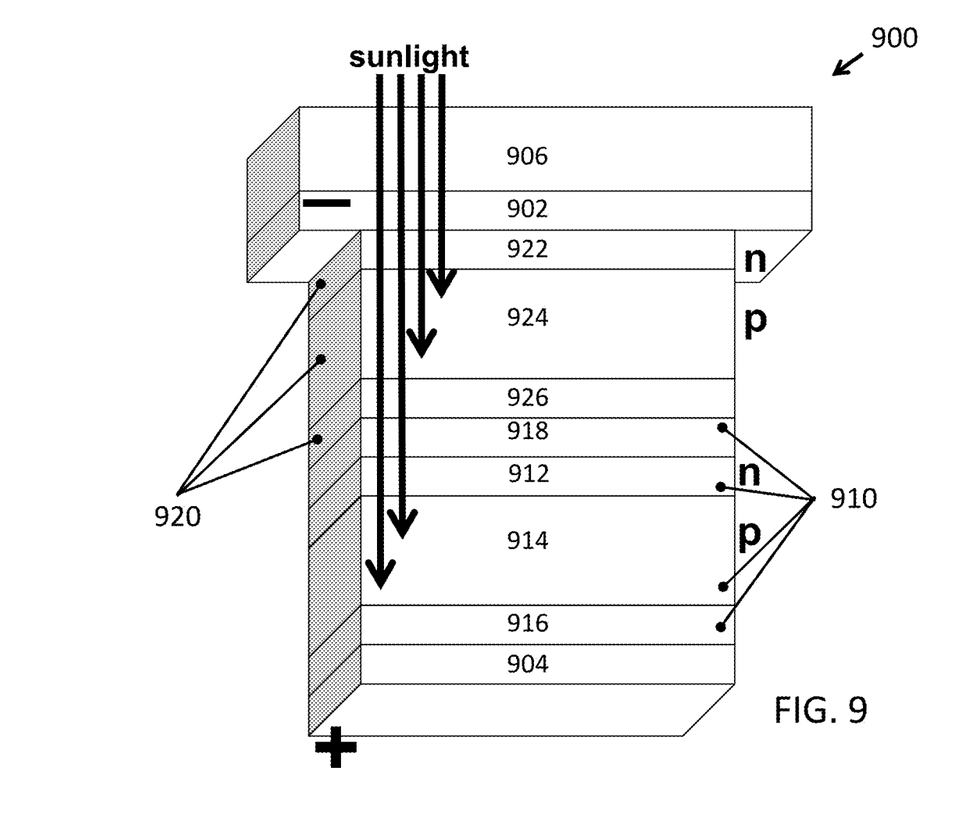
FIG. 9 depicts an example of a 2-junction solar cell with a CdHgTe bottom cell absorber and base.

FIG. 9 depicts an example of a 2-junction solar cell 900 with a thin-film bottom cell 910 and top cell 920. Bottom cell 910 includes an n-type heteroemitter 912 (e.g., n-CdHgTe), a p-type absorber or base 914 (e.g., p-type CdHgTe), a p-type back surface field (BSF) 916 (e.g., p-CdHgTe), and an interconnect layer 918 (e.g., TCO). The top cell 920 includes an n-type heteroemitter 922 (e.g., n-MgZnO), a polycrystalline p-type absorber or base 924 (e.g., p-CdTe), and a p-type BSF 926 (e.g., p-ZnTe). Top cell 920 and bottom cell 910 are in contact (e.g., direct contact) between the interconnect layer 918 and the p-type BSF 926, and positioned between an interconnect layer 902 and a metal back layer 904. A supersubstrate 906 (e.g., glass) is positioned on (e.g., in direct contact with) the interconnect layer 902. In some implementations, the heteroemitter 912 includes an n-type layer, an n-type layer and an intrinsic layer, a p-type layer, or a p-type layer and an intrinsic layer. In some implementations, the BSF layer 916 includes a p-type layer, a p-type layer and an intrinsic layer, an n-type layer, or an n-type layer and an intrinsic layer.

Figure 10:
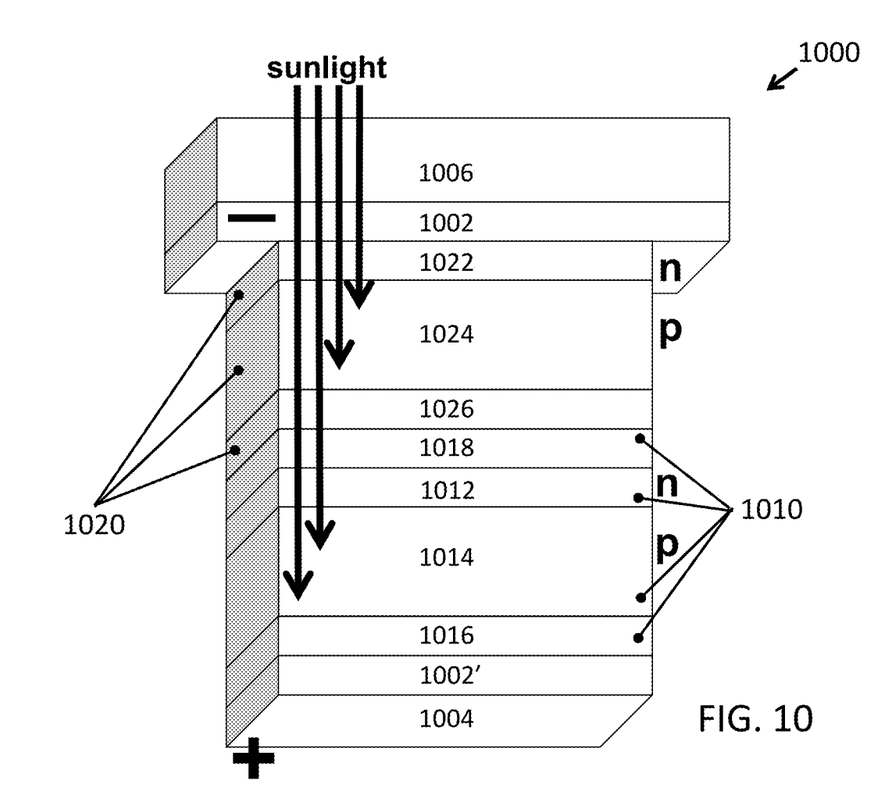
FIG. 10 depicts an example of a 2-junction solar cell configuration with a Ge or SiGe bottom cell absorber and base.

FIG. 10 depicts an example of a 2-junction solar cell 1000 with a thin-film bottom cell 1010 and a top cell 1020. Bottom cell 1010 includes an emitter 1012 (e.g., n-SiGe or a-SiGE), a p-type absorber or base 1014 (e.g., p-type Ge or p-type SiGe), a BSF 1016 (e.g., p-SiGe or a-SiGe, and an interconnect layer 1018 (e.g., TCO). The top cell 1020 includes an n-type heteroemitter 1022 (e.g., n-MgZnO), a polycrystalline p-type absorber or base 1024 (e.g., p-CdTe), and a p-type BSF 1026 (e.g., p-ZnTe). Top cell 1020 and bottom cell 1010 are in contact (e.g., direct contact) between the interconnect layer 1018 and the p-type BSF 1026, and positioned between an interconnect layer 1002 and a metal back layer 1004. A supersubstrate 1006 (e.g., glass) is positioned on (e.g., in direct contact with) the interconnect layer 1002. In some implementations, the heteroemitter 1012 includes an n-type layer, an n-type layer and an intrinsic layer, a p-type layer, or a p-type layer and an intrinsic layer. In some implementations, the BSF layer 1016 includes a p-type layer, a p-type layer and an intrinsic layer, an n-type layer, or an n-type layer and an intrinsic layer.

Figure 11:
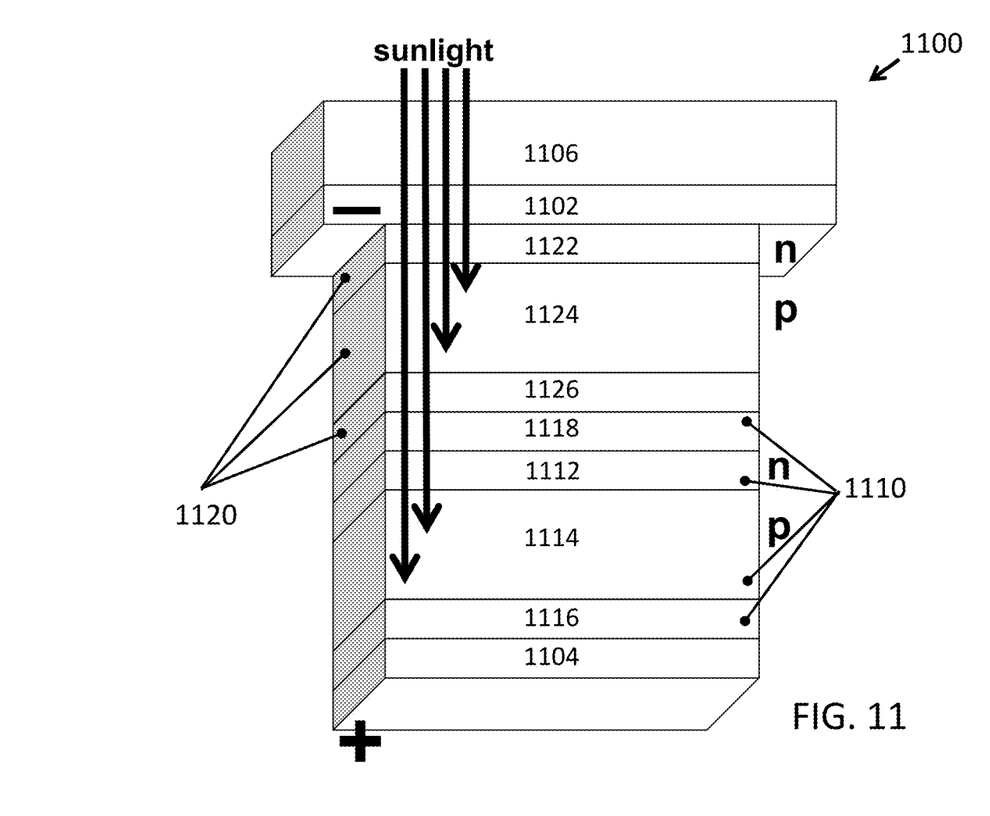
FIG. 11 depicts an example of a 2-junction solar cell configuration with a GaInSb bottom cell absorber and base.

FIG. 11 depicts an example of a 2-junction solar cell 1100 with a thin-film bottom cell 1110 and top cell 1120. Bottom cell 1110 includes a heteroemitter 1112 (e.g., n-AlGaInSb), a p-type absorber or base 1114 (e.g., p-GaInSb), a p-type BSF 1116 (e.g., p-AlGaInSb), and an interconnect layer 1118 (e.g., TCO). The top cell 1120 includes an n-type heteroemitter 1122 (e.g., n-MgZnO), a polycrystalline p-type absorber or base 1124 (e.g., p-CdTe), and a p-type BSF 1126 (e.g., p-ZnTe). Top cell 1120 and bottom cell 1110 are in contact (e.g., direct contact) between the interconnect layer 1118 and the p-type BSF 1126, and positioned between an interconnect layer 1102 (e.g., TCO) and a metal back layer 1104. A supersubstrate 1106 (e.g., glass) is positioned on (e.g., in direct contact with) the interconnect layer 1102. In some implementations, the emitter 1112 includes an n-type layer, an n-type layer and an intrinsic layer, a p-type layer, or a p-type layer and an intrinsic layer. In some implementations, the BSF layer 1116 includes a p-type layer, a p-type layer and an intrinsic layer, an n-type layer, or an n-type layer and an intrinsic layer.

Figure 12:
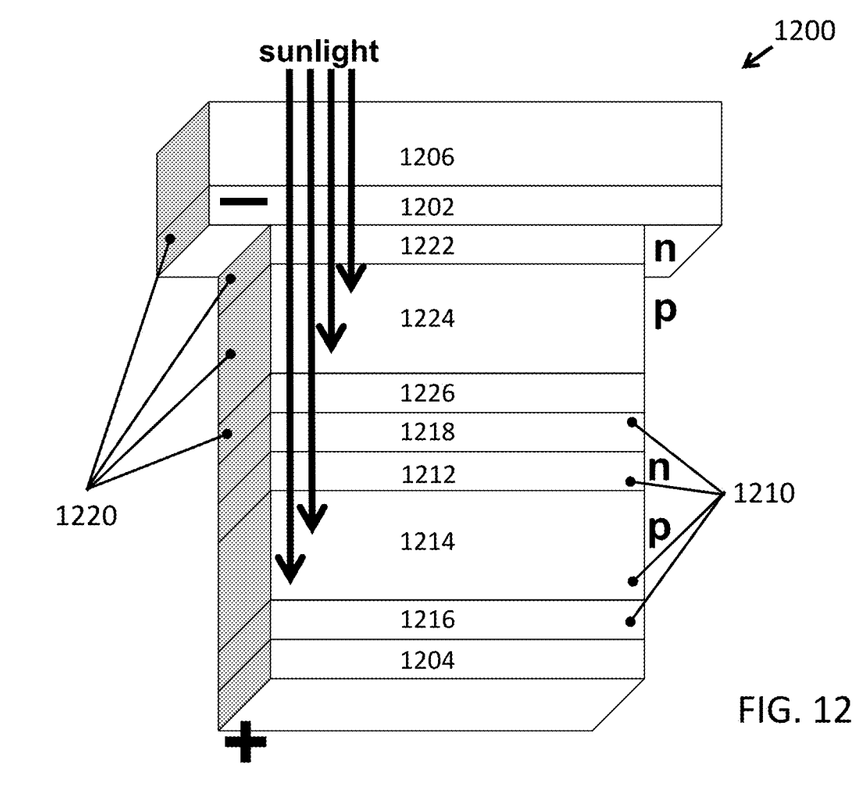
FIG. 12 depicts an example of a 2-junction solar cell configuration with a $Sb_2(Se_yTe_{1-y})_3$ (SST), $(Sb_xBi_{1-x})_2Se_3$ (SBS), or $(Sb_xBi_{1-x})_2(Se_yTe_{1-y})_3$ (SBST) bottom cell absorber and base.

FIG. 12 depicts an example of a 2-junction solar cell 1200 with a thin-film bottom cell 1210 and top cell 1220. Bottom cell 1210 includes an emitter or heteroemitter 1212, an absorber or base 1214 (e.g., $Sb_2(Se_yTe_{1-y})_3$ (SST), $(Sb_xBi_{1-x})_2Se_3$ (SBS), or $(Sb_xBi_{1-x})_2(Se_yTe_{1-y})_3$ (SBST)), a p-type BSF 1216, and an interconnect layer 1218 (e.g., TCO). The emitter or heteroemitter 1212 has a doping type that is opposite the doping type of the BSF layer 1216. The top cell 1220 includes an n-type heteroemitter 1222 (e.g., n-MgZnO), a polycrystalline p-type absorber or base 1224 (e.g., p-CdTe), and a p-type BSF 1226 (e.g., p-ZnTe). Top cell 1220 and bottom cell 1210 are in contact (e.g., direct contact) between the interconnect layer 1218 and the p-type BSF 1226, and positioned between an interconnect layer 1202 (e.g., TCO) and a metal back layer 1204. A supersubstrate 1206 (e.g., glass) is positioned on (e.g., in direct contact with) the interconnect layer 1202. In some implementations, the emitter or heteroemitter 1212 includes an n-type layer, an n-type layer and an intrinsic layer, a p-type layer, or a p-type layer and an intrinsic layer. In some implementations, the BSF layer 1216 includes a p-type layer, a p-type layer and an intrinsic layer, an n-type layer, or an n-type layer and an intrinsic layer.

Certain implementations include an electronic package, receiver, or module including one or more of the photovoltaic cell structures described herein.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A monolithic multi-junction solar cell comprising:
   one or more upper cells, wherein at least one of the one or more upper cells comprises a thin-film, polycrystalline absorber or base;
   a bottom cell comprising a thin-film, polycrystalline, low-bandgap absorber or base; and
   a transparent conducting oxide interconnect between the bottom cell and one of the one or more upper cells,
   wherein the bottom cell is grown monolithically on one of the one or more upper cells, and wherein one of the one or more upper cells and the bottom cell are connected in series in a current-matched configuration.

2. The solar cell of claim 1, wherein the solar cell comprises one, two, or three upper cells above the bottom cell.

3. The solar cell of claim 1, wherein one or more of the one or more upper cells is a Cd(Se)Te cell.

4. The solar cell of claim 1, wherein the bottom cell has a bandgap in a range of 0.3 eV to 1.2 eV.

5. The solar cell of claim 1, wherein the bottom cell further comprises an emitter, a back surface field, one or more interconnect layers, or any combination thereof.

6. The solar cell of claim 5, wherein the absorber or the base of the bottom cell, the emitter, the back surface field, or any combination thereof comprises CdHgTe.

7. The solar cell of claim 5, wherein the emitter, the back surface field, or any combination thereof comprises amorphous or polycrystalline Ge or SiGe.

8. The solar cell of claim 5, wherein the absorber or the base of the bottom cell comprise GaInSb and the emitter, the back surface field, or both comprise AlGaInSb.

9. The solar cell of claim 5, wherein the absorber or the base of the bottom cell, the emitter, the back surface field, or any combination thereof comprises $Sb_2(Se_yTe_{1-y})_3$ (SST), $(Sb_xBi_{1-x})_2Se_3$ (SBS), or $(Sb_xBi_{1-x})_2(Se_yTe_{1-y})_3$ (SBST).

10. The solar cell of claim 5, wherein the emitter comprises:
    an n-type layer;
    an n-type layer and an intrinsic layer;
    a p-type layer; or
    a p-type layer and an intrinsic layer.

11. The solar cell of claim 5, wherein the back surface field comprises:
    a p-type layer;
    a p-type layer and an intrinsic layer;
    an n-type layer; or
    an n-type layer and an intrinsic layer.

12. The solar cell of claim 1, wherein the bottom cell is configured to receive light though two surfaces, such that the bottom cell has bifacial operation.

13. The solar cell of claim 1, wherein the one or more upper cells comprise two or more upper cells, and the two or more upper cells are connected in series in a current-matched configuration.

14. The solar cell of claim 1, wherein the monolithically grown bottom cell allows growth of compositions of bottom cell layers with bandgaps selected to partition the solar spectrum, to produce the same current density in each subcell of a multi-junction cell in which subcells of different bandgaps are connected in series.

15. The solar cell of claim 1, wherein the monolithically grown bottom cell allows lower recombination rates in the bottom cell, leading to high output voltages.

16. The solar cell of claim 1, wherein the monolithically grown bottom cell allows the multijunction cell to be formed without processing different subcells separately on different substrates for later integration into the multi-junction cell.

17. The solar cell of claim 1, wherein the topmost cell of the one or more upper cells comprises a thin-film, polycrystalline layer or layers.

18. The solar cell of claim 1, wherein at least one of the one or more upper cells comprises a thin-film, polycrystalline layer or layers.

19. The solar cell of claim 1, wherein the monolithically grown bottom cell allows the high-power-producing topmost cell to be deposited with highly developed processes that have been developed for single-junction cells.

20. The solar cell of claim 1, wherein the monolithically grown bottom cell allows the one or more upper cells to be deposited without detrimental effects from growing an upper cell on a new bottom cell material.

21. The solar cell of claim 1, wherein the monolithically grown bottom cell allows the bottom cell to be grown after growing the upper cells, thereby avoiding degradation from the thermal budget of growing an upper cell on an already formed bottom cell.

22. The solar cell of claim 1, wherein the bottom cell has a bandgap of less than 1 eV, thereby resulting in a lower fill factor for the bottom cell than the fill factor for a higher bandgap bottom cell, making the multi junction cell power output more consistent over a wider range of spectral and current mismatch conditions.

23. The solar cell of claim 22, wherein the bottom cell has a bandgap of 0.5-0.8 eV.

24. The solar cell of claim 23, wherein the bottom cell has a bandgap of 0.6-0.7 eV.

25. The solar cell of claim 12, wherein the bifacial operation of the polycrystalline bottom cell creates additional photogenerated current density in the bottom cell, allowing one or more of the following multi-junction solar cell features:
- a higher bandgap bottom cell;
- a lower bandgap top cell;
- upper cells with higher reflectivity or greater light absorption;
- interconnect layers between upper cells and/or between the upper cells and the bottom cell with higher reflectivity or greater light absorption;
- a bottom cell with lower minority-carrier collection efficiency;
- greater multi-junction cell current;
- greater multi-junction cell efficiency; and/or
- greater multi-junction power output consistency over a wider range of spectral and current mismatch conditions.

26. The solar cell of claim 1, wherein the transparent conducting oxide interconnect layer is in direct contact with one of the one or more upper cells.

27. The solar cell of claim 1, wherein the transparent conducting oxide interconnect layer is in direct contact with the bottom cell.

28. The solar cell of claim 1, wherein the bottom cell is grown monolithically on a layer stack comprising the one or more upper cells and the transparent conducting oxide interconnect layer.

29. The solar cell of claim 1, wherein one of the one or more upper cells comprises the transparent conducting oxide interconnect layer.

30. The solar cell of claim 1, wherein the bottom cell comprises the transparent conducting oxide interconnect layer.

* * * * *

UNITED STATES PATENT AND TRADEMARK OFFICE
CERTIFICATE OF CORRECTION

PATENT NO. : 11,967,663 B2  
APPLICATION NO. : 17/347486  
DATED : April 23, 2024  
INVENTOR(S) : Richard R. King Page 1 of 1

It is certified that error appears in the above-identified patent and that said Letters Patent is hereby corrected as shown below:

On the Title Page

Column 2, Item (57) ABSTRACT, Line 1, delete "multi junction" and insert -- multi-junction --.

In the Claims

Claim 8, Column 12, Line 15, delete "GaInSb" and insert -- GaInSb --.

Claim 22, Column 13, Line 9, delete "multi junction" and insert -- multi-junction --.

Signed and Sealed this  
Fifteenth Day of July, 2025

Coke Morgan Stewart  
*Acting Director of the United States Patent and Trademark Office*